United States Patent
Matsushita

(10) Patent No.: US 12,198,949 B2
(45) Date of Patent: Jan. 14, 2025

(54) THERMOCOUPLE GUIDE AND CERAMIC HEATER

(71) Applicant: NGK INSULATORS, LTD., Nagoya (JP)

(72) Inventor: Ryohei Matsushita, Yokkaichi (JP)

(73) Assignee: NGK INSULATORS, LTD., Nagoya (JP)

( * ) Notice: Subject to any disclaimer, the term of this patent is extended or adjusted under 35 U.S.C. 154(b) by 406 days.

(21) Appl. No.: 17/303,546

(22) Filed: Jun. 2, 2021

(65) Prior Publication Data

US 2021/0391193 A1   Dec. 16, 2021

(30) Foreign Application Priority Data

Jun. 12, 2020   (JP) ................. 2020-102174

(51) Int. Cl.
| | |
|---|---|
| H01L 21/67 | (2006.01) |
| G01K 1/143 | (2021.01) |
| H05B 3/14 | (2006.01) |
| H05B 3/22 | (2006.01) |
| G01K 7/02 | (2021.01) |

(52) U.S. Cl.
CPC ........ *H01L 21/67103* (2013.01); *G01K 1/143* (2013.01); *H05B 3/143* (2013.01); *H05B 3/22* (2013.01); *G01K 7/02* (2013.01)

(58) Field of Classification Search
CPC ........... G01K 1/14; G01K 1/143; G01K 7/02; G01K 7/04; H05B 1/0233; H05B 2203/003; H05B 2203/005; H05B 2203/016; H05B 3/02; H05B 3/143; H05B 3/22; H05B 3/283; H05B 3/74; H01L 21/67103; H01L 21/67248
USPC ............................. 219/443.1–444.1
See application file for complete search history.

(56) References Cited

U.S. PATENT DOCUMENTS 4,217,463 A * 8/1980 Swearingen ............. G01K 7/02
374/E7.004
4,527,909 A * 7/1985 Dale ........................ G01K 1/08
374/208

(Continued)

FOREIGN PATENT DOCUMENTS

CN   102598212 A   7/2012
JP   H05-052665 A   3/1993

(Continued)

OTHER PUBLICATIONS

Japanese Office Action (with English translation), Japanese Application No. 2020-102174, dated Nov. 1, 2022 (8 pages).

(Continued)

*Primary Examiner* — Sang Y Paik
(74) *Attorney, Agent, or Firm* — BURR PATENT LAW, PLLC

(57) ABSTRACT

A thermocouple guide includes a first tube portion of a straight shape, and a second tube portion connected to the first tube portion and including a curved section that is formed to turn an extension direction from the first tube portion. An outer diameter of at least a tip-side part of the curved section, the tip-side part extending from a tip end of the curved section through a predetermined length, is smaller than an outer diameter of the first tube portion.

11 Claims, 9 Drawing Sheets

(56) References Cited

U.S. PATENT DOCUMENTS

| | | | | |
|---|---|---|---|---|
| 5,071,258 | A | * | 12/1991 | Usher .................... G01K 1/105 |
| | | | | 374/140 |
| 5,137,582 | A | * | 8/1992 | Kasman .................. G01K 1/10 |
| | | | | 374/E1.021 |
| 11,664,244 | B2 | * | 5/2023 | Takahashi .............. H05B 3/283 |
| | | | | 219/444.1 |
| 2002/0162835 | A1 | * | 11/2002 | Toya .................... H05B 3/0047 |
| | | | | 118/724 |
| 2009/0052498 | A1 | * | 2/2009 | Halpin .................. G05D 23/22 |
| | | | | 374/E7.004 |
| 2012/0211933 | A1 | | 8/2012 | Goto | |
| 2013/0259090 | A1 | | 10/2013 | Schlipf | |

FOREIGN PATENT DOCUMENTS

| | | |
|---|---|---|
| JP | 2008-128694 A | 6/2008 |
| KR | 10-2012-0060911 A | 6/2012 |
| TW | 201222696 A1 | 6/2012 |
| WO | 2012/039453 A1 | 3/2012 |
| WO | 2013/162000 A1 | 10/2013 |

OTHER PUBLICATIONS

Taiwanese Office Action dated May 31, 2022 (Application No. 110120593).

Japanese Office Action dated May 31, 2022 (Application No. 110120593).

Korean Office Action (with English translation) dated Mar. 29, 2023 (Application No. 10-2021-0070723).

Chinese Office Action (with English translation) dated Dec. 1, 2023 (Application No. 202110656062.8).

* cited by examiner

THERMOCOUPLE GUIDE AND CERAMIC HEATER

BACKGROUND OF THE INVENTION

1. Field of the Invention

The present invention relates to a thermocouple guide and a ceramic heater.

2. Description of the Related Art

As an example of ceramic heaters, the so-called 2-zone heater has hitherto been known in which resistance heating elements are independently embedded in an inner peripheral side and an outer peripheral side of a disk-shaped ceramic plate having a wafer placement surface. For example, Patent Literature (PTL) 1 discloses a shaft-equipped ceramic heater 410 illustrated in FIG. 9. In the disclosed shaft-equipped ceramic heater 410, a temperature on an outer peripheral side of a ceramic plate 420 is measured by an outer-peripheral-side thermocouple 450. A thermocouple guide 432 in the form of a tubular member extends straight through the inside of a straight shaft 440 upward from below and is then bent in a circular arc shape to turn 90°. The thermocouple guide 432 is attached to a slit 426a formed in a region of a rear surface of the ceramic plate 420, the region being surrounded by the straight shaft 440 when viewed from below. The slit 426a defines an inlet portion of a thermocouple passage 426. The outer-peripheral-side thermocouple 450 is inserted through a tube of the thermocouple guide 432 and extends up to an end position of the thermocouple passage 426.

CITATION LIST

Patent Literature

PTL 1: WO 2012/039453 A1 (FIG. 11)

SUMMARY OF THE INVENTION

However, because the thermocouple guide 432 is formed by bending one tubular member into a circular arc shape to include a straight tube portion 432a and a curved tube portion 432b, the following problems have occurred. Thinning the curved tube portion 432b leads to thinning of the straight tube portion 432a. This causes the problem that rigidity of the thermocouple guide 432 is insufficient. On the other hand, thickening the curved tube portion 432b leads to thickening of the straight tube portion 432a. This causes the problem that a width of the slit 426a has to be increased.

The present invention has been made to solve the above-mentioned problems, and a main object of the present invention is to narrow the width of the inlet portion of the thermocouple passage while maintaining rigidity of the thermocouple guide.

The present invention provides a thermocouple guide including:
 a first tube portion of a straight shape; and
 a second tube portion connected to the first tube portion and including a curved section that is formed to turn an extension direction from the first tube portion,
 wherein an outer diameter of at least a tip-side part of the curved section, the tip-side part extending from a tip end of the curved section through a predetermined length, is smaller than an outer diameter of the first tube portion.

The above-described thermocouple guide is used as follows. The tip-side part of the thermocouple guide is arranged in an inlet portion of a thermocouple passage formed in a plate in which a resistance heating element is incorporated. A thin and long thermocouple is passed through the thermocouple guide, namely through the first tube portion of the straight shape and the second tube portion including the curved section. Then, the thermocouple is guided into the thermocouple passage. In the thermocouple guide, the outer diameter of at least the tip-side part of the curved section of the second tube portion, the tip-side part extending from the tip end of the curved section through the predetermined length, is smaller than that of the first tube portion. Since the tip-side part is a part arranged in the thermocouple passage and the outer diameter of the tip-side part is smaller than that of the first tube portion, a width of the inlet portion of the thermocouple passage can be reduced. On the other hand, the outer diameter of the first tube portion of the thermocouple guide is greater than that of the tip-side part. Therefore, rigidity of the first tube portion can be held relatively high.

In the thermocouple guide according to the present invention, the second tube portion may be welded to the first tube portion. With this feature, the thermocouple guide according to the present invention can be obtained by preparing the second tube portion and the first tube portion separately, and by welding both the tube portions to each other.

In the thermocouple guide according to the present invention, an inner diameter of at least the tip-side part of the curved section may be smaller than an inner diameter of the first tube portion. With this feature, the outer diameter of the tip-side part can be made even smaller than that of the first tube portion in comparison with the case in which the inner diameter of the tip-side part is equal to that of the first tube portion. Furthermore, when the outer diameter of the tip-side part is set to a predetermined value, a wall thickness of the tip-side part is increased corresponding to a decrease in the inner diameter of the tip-side part. Hence rigidity of the tip-side part can be increased.

In the thermocouple guide according to the present invention, an outer diameter of the second tube portion along an entire length may be smaller than the outer diameter of the first tube portion. Particularly, by adopting the above-described feature when the second tube portion is welded to the first tube portion, the second tube portion can be easily prepared because the diameter of the second tube portion is the same along the entire length. In such a case, an inner diameter of the second tube portion along the entire length may be smaller than an inner diameter of the first tube portion. With this feature, the outer diameter of the second tube portion can be made even smaller than that of the first tube portion in comparison with the case in which the inner diameter of the second tube portion is equal to that of the first tube portion. Furthermore, when the outer diameter of the second tube portion is set to a predetermined value, a wall thickness of the second tube portion is increased corresponding to a decrease in the inner diameter of the second tube portion. Hence rigidity of the second tube portion can be increased.

In the thermocouple guide according to the present invention, preferably, a curvature radius of the curved section is 20 mm or more and 50 mm or less, a stroke length of the curved section is 20 mm or more and 50 mm or less, and the curved section is formed to turn the extension direction from the first tube portion through an angle of 50° or more and 90° or less. With this feature, after passing the thin and long thermocouple through the first tube portion and the second tube portion of the thermocouple guide, the thermocouple can be smoothly guided into the thermocouple passage.

The present invention further provides a ceramic heater including:
- a ceramic plate formed in a disk-like shape and having a wafer placement surface;
- a tubular shaft bonded to a rear surface of the ceramic plate on an opposite side to the wafer placement surface;
- an inner-peripheral-side resistance heating element embedded in an inner peripheral zone of the ceramic plate;
- an outer-peripheral-side resistance heating element embedded in an outer peripheral zone of the ceramic plate;
- associated components including a pair of terminals of the inner-peripheral-side resistance heating element and a pair of terminals of the outer-peripheral-side resistance heating element;
- an elongate hole extending from a start point in a region of the rear surface of the ceramic plate, the region being positioned within the tubular shaft when viewed from below, to an end position in an outer peripheral portion of the ceramic plate;
- an elongate groove defining an inlet portion of the elongate hole; and
- any one of the above-described thermocouple guides with the tip-side part of the curved section being arranged in the elongate groove.

In the thermocouple guide of the above-described ceramic heater, the outer diameter of at least the tip-side part of the curved section of the second tube portion, the tip-side part extending from the tip end of the curved section through the predetermined length, is smaller than that of the first tube portion. Since the tip-side part is a part arranged in the thermocouple passage and the outer diameter of the tip-side part is smaller than that of the first tube portion, a width of the inlet portion of the thermocouple passage can be reduced. On the other hand, the outer diameter of the first tube portion of the thermocouple guide is greater than that of the tip-side part. Therefore, rigidity of the first tube portion can be held relatively high.

In the ceramic heater according to the present invention, the elongate hole may be a thermocouple-insertion elongate hole into which a thermocouple is to be inserted. With this feature, the thermocouple can be inserted by utilizing the elongate hole.

In the ceramic heater according to the present invention, a length of the elongate groove may be set to be longer than or equal to a length of the tip-side part of the curved section of the thermocouple guide, the tip-side part being arranged in the elongate groove. With this feature, the thermocouple guide can be more easily inserted into the elongate hole.

The ceramic heater according to the present invention may further include a thermocouple inserted through both the thermocouple guide and the elongate hole.

DETAILED DESCRIPTION OF THE INVENTION

Figure 1:
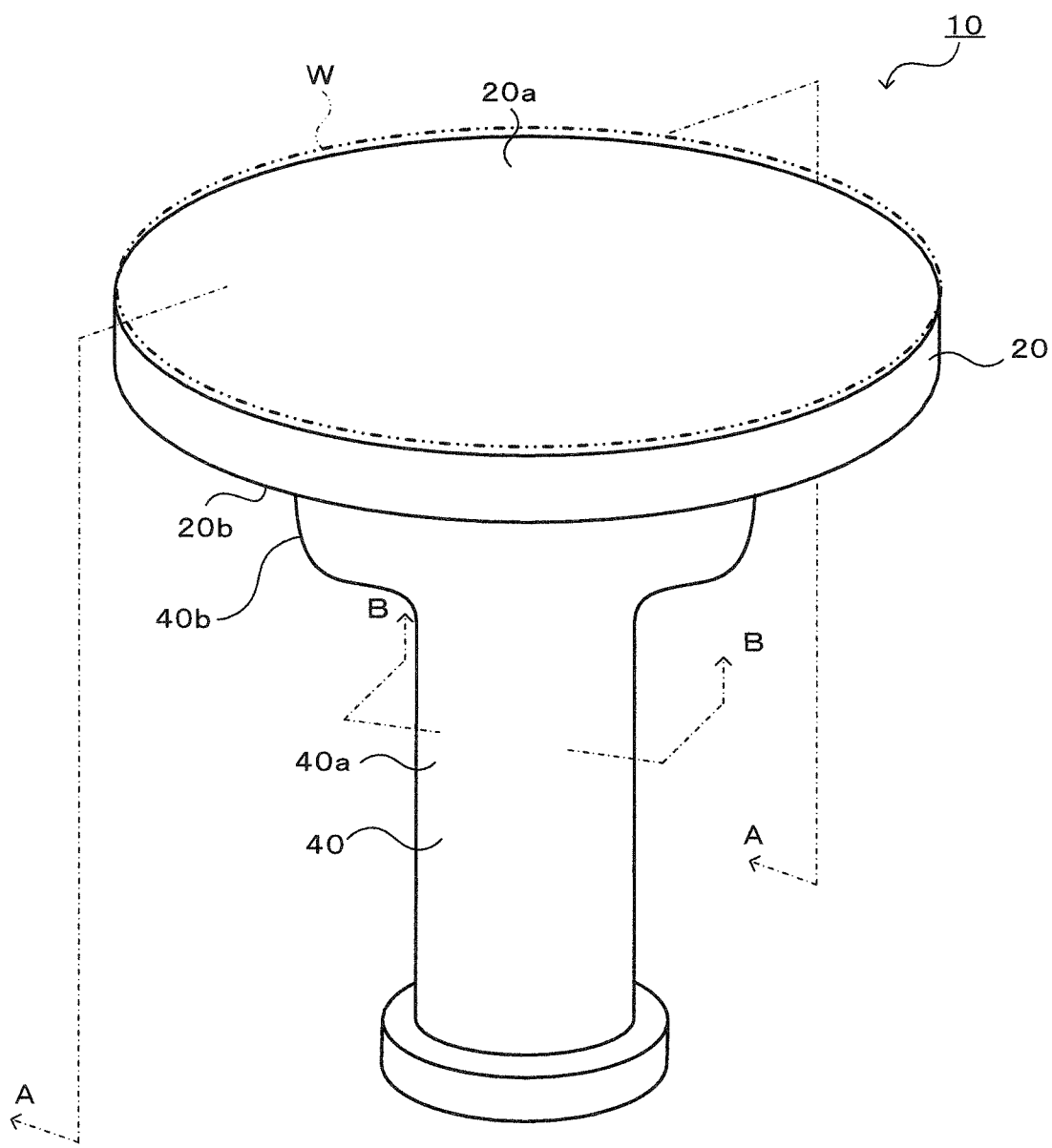
FIG. 1 is a perspective view of a ceramic heater 10.
Figure 2:
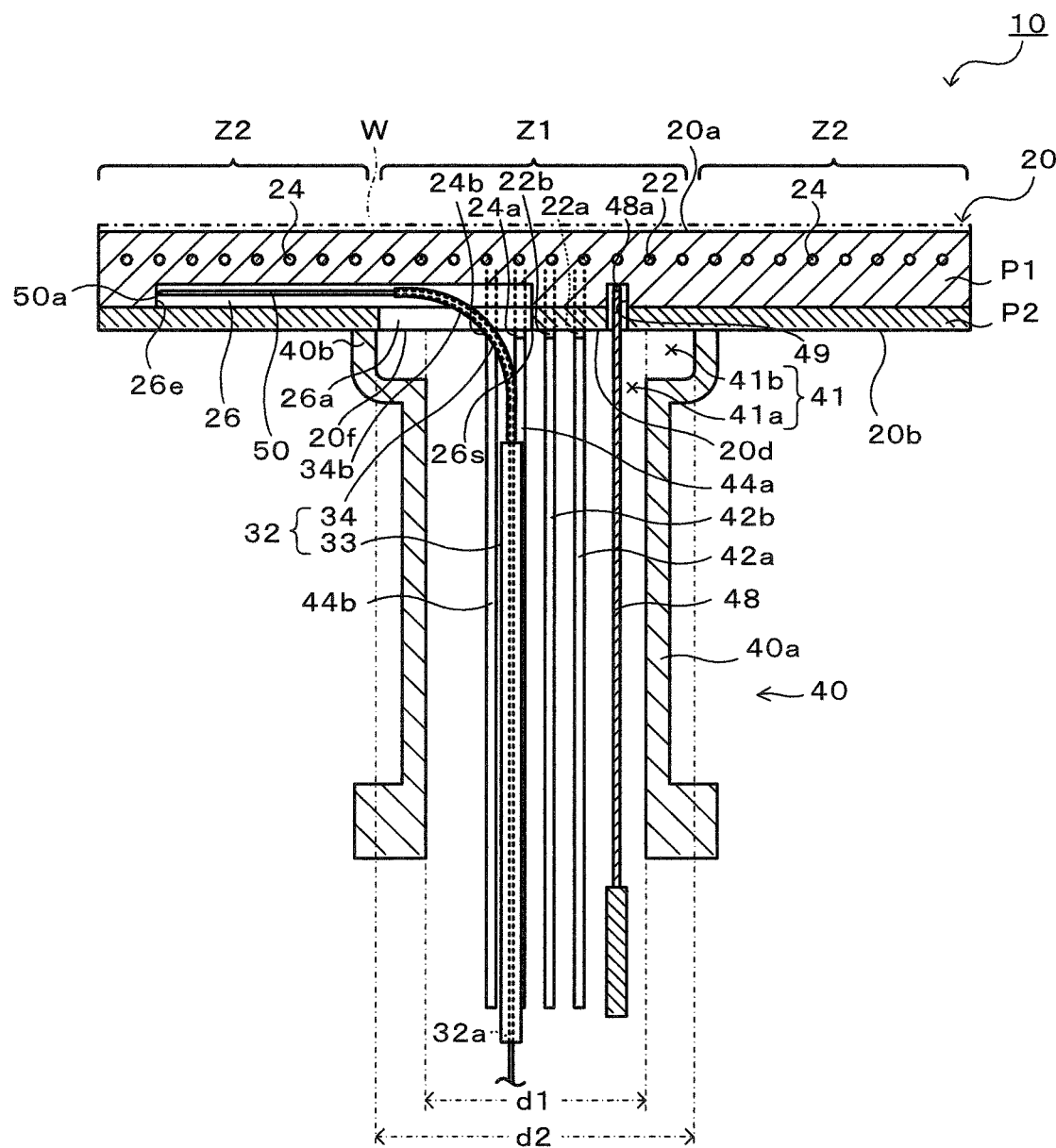
FIG. 2 is a sectional view taken along A-A in FIG. 1.
Figure 3:
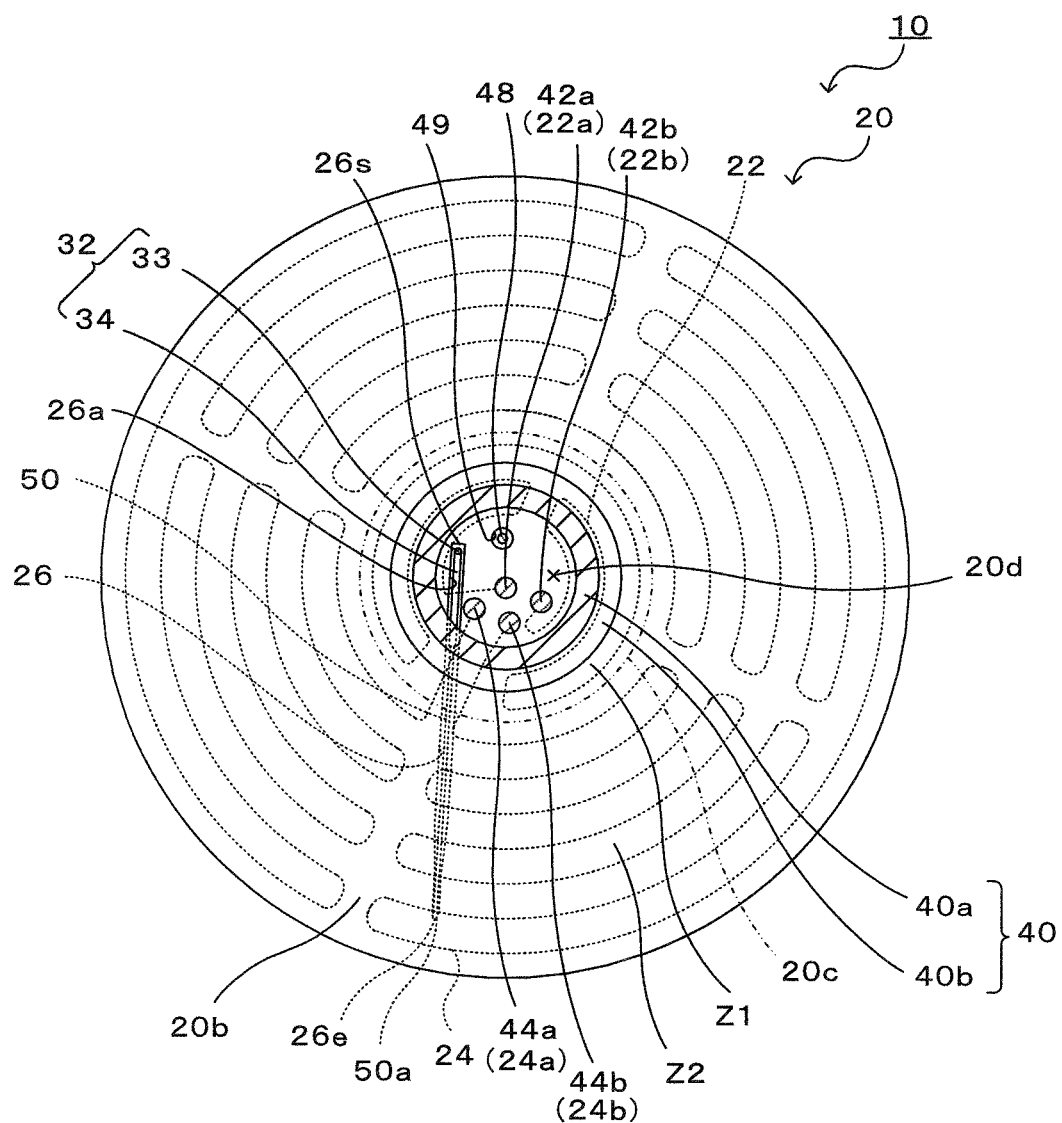
FIG. 3 is a sectional view taken along B-B in FIG. 1.
Figure 4:
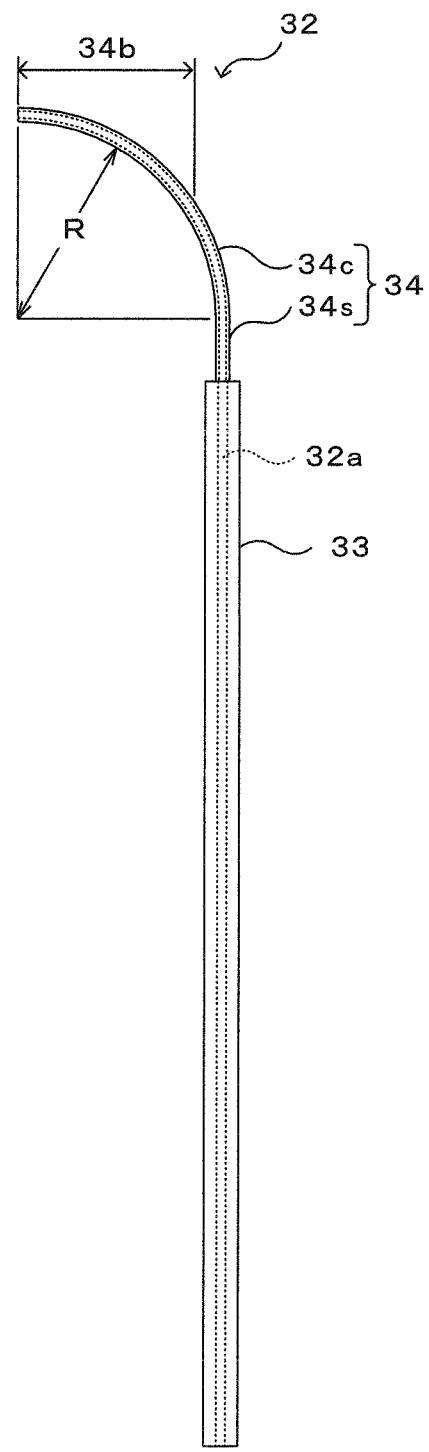
FIG. 4 is a front view of a thermocouple guide 32.
Figure 5:
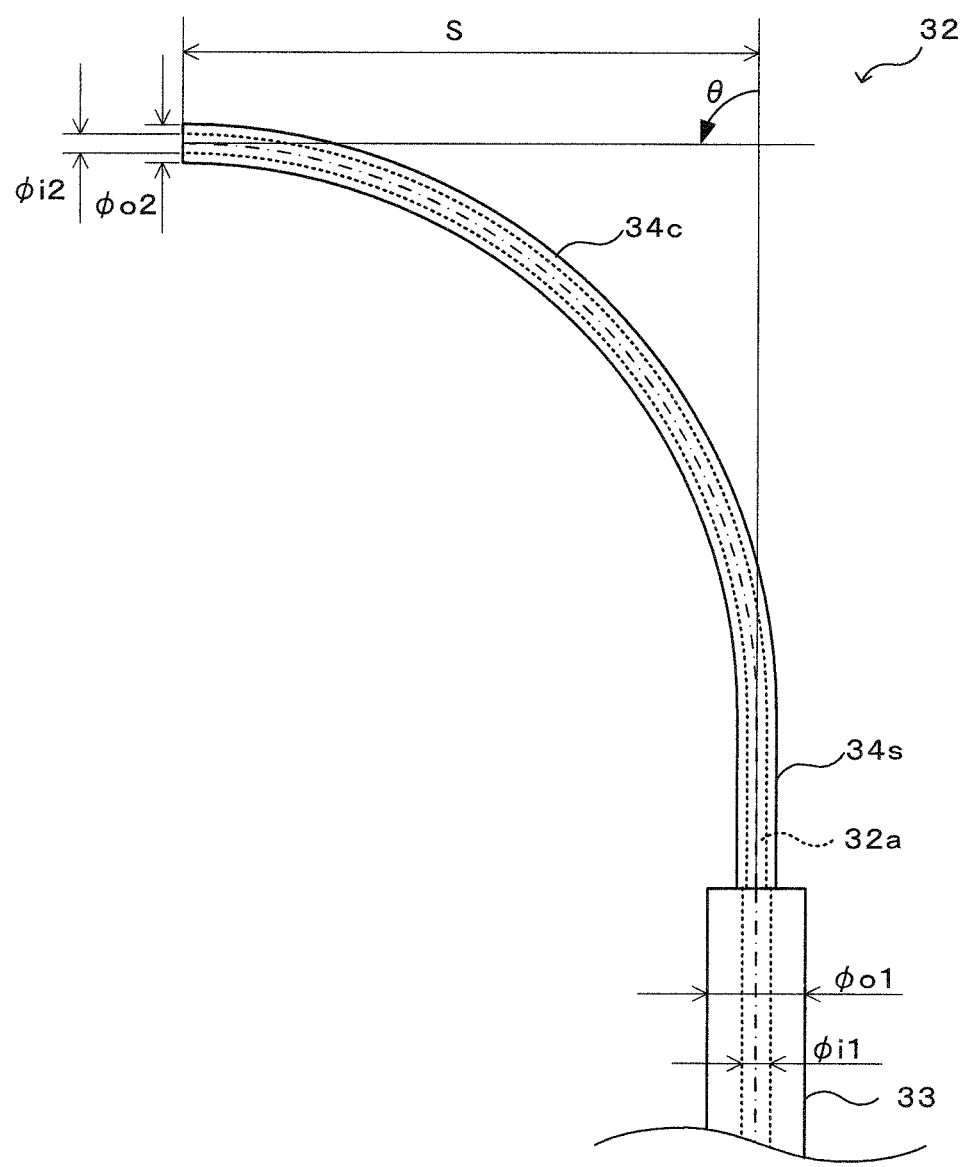
FIG. 5 is a partial enlarged view of a second tube portion 34 of the thermocouple guide 32 and the surroundings thereof.
Figure 6:
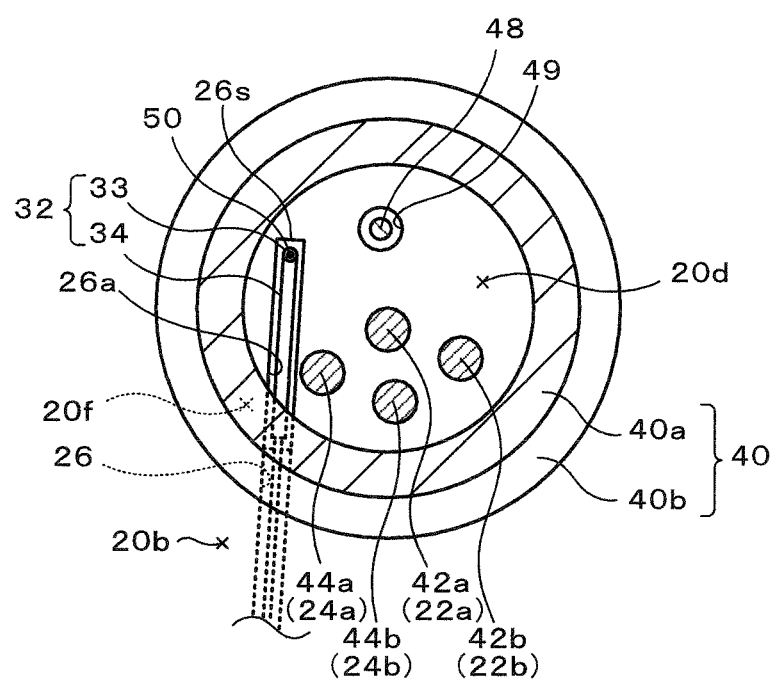
FIG. 6 is an enlarged view of a central region of FIG. 3.

A preferred embodiment of the present invention will be described below with reference to the drawings. FIG. 1 is a perspective view of a ceramic heater 10, FIG. 2 is a sectional view taken along A-A in FIG. 1, FIG. 3 is a sectional view taken along B-B in FIG. 1, FIG. 4 is a front view of a thermocouple guide 32, FIG. 5 is a partial enlarged view of a second tube portion 34 of the thermocouple guide 32 and the surroundings thereof, and FIG. 6 is an enlarged view of a central region of FIG. 3.

The ceramic heater 10 is used to heat a wafer W on which processing, such as etching or CVD, is to be performed, and is installed inside a vacuum chamber (not illustrated). The ceramic heater 10 includes a disk-shaped ceramic plate 20 having a wafer placement surface 20a, and a tubular shaft 40 bonded to a surface (rear surface) 20b of the ceramic plate 20 on an opposite side to the wafer placement surface 20a.

The ceramic plate 20 is a disk-shaped plate made of a ceramic material represented by, for example, aluminum nitride or alumina. A diameter of the ceramic plate 20 is not limited to a particular value and is, for example, about 300 mm. The ceramic plate 20 is divided into an inner peripheral zone Z1 of a small circular shape and an outer peripheral zone Z2 of an annular shape by an imaginary boundary 20c (see FIG. 3) that is concentric to the ceramic plate 20. An inner-peripheral-side resistance heating element 22 is embedded in the inner peripheral zone Z1 of the ceramic plate 20, and an outer-peripheral-side resistance heating element 24 is embedded in the outer peripheral zone Z2. The resistance heating elements 22 and 24 are each constituted by a coil containing, for example, molybdenum, tungsten, or tungsten carbide as a main component. As illustrated in FIG. 2, the ceramic plate 20 is fabricated by face-to-face bonding of an upper plate P1 and a lower plate P2 thinner than the upper plate P1.

The tubular shaft 40 is made of ceramic, for example, aluminum nitride or alumina, as in the ceramic plate 20. The tubular shaft 40 includes a small-diameter portion 40a and a large-diameter portion 40b. The small-diameter portion 40a is a tubular portion that extends from a lower end of the tubular shaft 40 to a predetermined height, and that has an inner diameter d1. The large-diameter portion 40b is a tubular portion that extends from the predetermined height of the tubular shaft 40 up to an upper end of the tubular shaft 40 after being radially expanded at the predetermined height, and that has an inner diameter d2 (>d1). The tubular shaft 40 is diffusion-bonded at its upper end (end surface of the large-diameter portion 40b) to the ceramic plate 20. An inner space 41 of the tubular shaft 40 includes a circular cylindrical space 41a with the same diameter as the inner diameter of the small-diameter portion 40a, and an annular expanded space 41b positioned on an outer side of the circular cylindrical space 41a and surrounded by the large-diameter portion 40b. The expanded space 41b is a space through which a tip of the second tube portion 34 of the thermocouple guide 32, described later, can be inserted with an operation of causing the thermocouple guide 32 to turn.

As illustrated in FIG. 3, the inner-peripheral-side resistance heating element 22 is formed such that it starts from one of a pair of terminals 22a and 22b and reaches the other of the pair of terminals 22a and 22b after being wired in a one-stroke pattern substantially over the entirety of the inner peripheral zone Z1 while being folded at a plurality of turn-around points. The pair of terminals 22a and 22b are disposed in a within-shaft region 20d (namely, a region of the rear surface 20b of the ceramic plate 20, the region being positioned within the small-diameter portion 40a when viewed from below). Power feeder rods 42a and 42b made of metal (for example, Ni) are bonded to the pair of terminals 22a and 22b, respectively.

As illustrated in FIG. 3, the outer-peripheral-side resistance heating element 24 is formed such that it starts from one of a pair of terminals 24a and 24b and reaches the other of the pair of terminals 24a and 24b after being wired in a one-stroke pattern substantially over the entirety of the outer peripheral zone Z2 while being folded at a plurality of turn-around points. The pair of terminals 24a and 24b are disposed in the within-shaft region 20d of the rear surface 20b of the ceramic plate 20. Power feeder rods 44a and 44b made of metal (for example, Ni) are bonded to the pair of terminals 24a and 24b, respectively.

Inside the ceramic plate 20, as illustrated in FIG. 2, an elongate hole 26 through which an outer-peripheral-side thermocouple 50 is to be inserted is formed parallel to the wafer placement surface 20a. The elongate hole 26 extends from a start point 26s in the within-shaft region 20d of the rear surface 20b of the ceramic plate 20 to a predetermined end position 26e in an outer peripheral portion of the ceramic plate 20. As illustrated in FIG. 3, a lateral width of the elongate hole 26 gradually reduces toward the end position 26e from a position a little away inward from the end position 26e. As illustrated in FIGS. 3 and 5, the elongate hole 26 is formed along a direction deviated from a radial direction of the ceramic plate 20. An inlet portion of the elongate hole 26 ranging from the start point 26s to an expanded region 20f (namely, a region of the rear surface 20b positioned within the expanded space 41b when viewed from below) is in the form of an elongate groove 26a into which the tip of the second tube portion 34 of the thermocouple guide 32 is to be fitted. The elongate groove 26a is opened to the inner space 41 of the tubular shaft 40. In this embodiment, the elongate groove 26a extends from the start point 26s to an outer peripheral edge of the expanded region 20f. A length of the elongate groove 26a is set to be longer than or equal to that of a tip-side part 34b of a curved section 34c of the thermocouple guide 32, the tip-side part 34b being arranged in the elongate groove 26a. The terminals 22a, 22b, 24a and 24b are disposed at positions in the within-shaft region 20d except for the elongate groove 26a.

The thermocouple guide 32 is a metal-made tubular member including a guide hole 32a. As illustrated in FIG. 4, the thermocouple guide 32 includes a first tube portion 33 of a straight shape and the second tube portion 34 including the curved section 34c. The first tube portion 33 is a tubular member extending straight from a tip end to a base end. The second tube portion 34 is formed by bending one metal-made tubular member and includes a straight section 34s and the curved section 34c. The straight section 34s extends straight in the same direction as the first tube portion 33. The second tube portion 34 is welded at a base end of the straight section 34s to the tip end of the first tube portion 33. The curved section 34c is formed to turn an extension direction from the first tube portion 33. More specifically, as illustrated in FIG. 5, the curved section 34c is formed to turn the extension direction from the first tube portion 33 through an angle $\theta$ relative to an axial direction of the first tube portion 33. An outer diameter $\phi o2$ of the second tube portion 34 along an entire length (including the tip-side part 34b) is smaller than an outer diameter $\phi o1$ of the first tube portion 33. An inner diameter $\phi i2$ of the second tube portion 34 along an entire length (including the tip-side part 34b) is smaller than an inner diameter $\phi i1$ of the first tube portion 33.

In manufacturing the thermocouple guide 32, the first tube portion 33 and the second tube portion 34 are separately prepared in advance, and the base end of the second tube portion 34 is welded to the tip end of the first tube portion 33. More specifically, the first tube portion 33 and the second tube portion 34 are welded after positioning them such that a center axis of the first tube portion 33 and a center axis of the second tube portion 34 are coaxial with each other. The first tube portion 33 and the second tube portion 34 are preferably welded such that the center axes of both the tube portions are aligned as coaxial as possible. However, even when both the axes are slightly deviated from a coaxial state, there is no problem insofar as both the tube portions are welded with such a deviation width as ensuring that the guide hole 32a does not communicate with the outside through a welded zone.

A curvature radius R and a stroke length S (horizontal distance from the tip end of the second tube portion 34 to the center axis of the first tube portion 33) of the curved section 34c are preferably set as appropriate depending on the inner diameter of the tubular shaft 40. For example, when the inner diameter of the small-diameter portion 40a of the tubular shaft 40 is 35 mm or more and 45 mm or less, the curvature radius R of the curved section 34c is preferably 20 mm or more and 50 mm or less and more preferably 20 mm or more and 30 mm or less. The stroke length S of the curved section 34c is preferably 20 mm or more and 50 mm or less and more preferably 20 mm or more and 30 mm or less. The angle $\theta$ is preferably 50° or more and 90° or less and more preferably 75° or more and 90° or less. FIGS. 4 and 5 illustrate an example in which the angle $\theta$ is 90°. The outer diameter $\phi o1$ of the first tube portion 33 is preferably 2.4 mm or more and 5 mm or less, and the outer diameter $\phi o2$ of the second tube portion 34 is preferably 1.9 mm or more and 2.3 mm or less. The inner diameter $\phi i1$ of the first tube portion 33 is preferably 1.8 mm or more and 2.5 mm or less, and the inner diameter $\phi i2$ of the second tube portion 34 is preferably 1.6 mm or more and 2.0 mm or less.

The thermocouple guide 32 is arranged such that the first tube portion 33 of the straight shape extends in a vertical direction relative to the wafer placement surface 20a, and that an orientation of the thermocouple guide 32 is turned from the vertical direction to a horizontal direction through the curved section 34c of the second tube portion 34. The outer-peripheral-side thermocouple 50 is inserted through the guide hole 32a of the thermocouple guide 32. The tip end of the second tube portion 34 may be simply fitted into the elongate groove 26a or may be fixedly bonded or stuck in the elongate groove 26a. The first tube portion 33 may not need to be fixed or may be securely fixed to or located on, for example, a support (not illustrated) that is fixed to a base end (lower opening end) of the tubular shaft 40 and that supports the ceramic heater 10.

As illustrated in FIG. 2, the power feeder rods 42a and 42b connected respectively to the pair of terminals 22a and 22b of the inner-peripheral-side resistance heating element 22 and the power feeder rods 44a and 44b connected respectively to the pair of terminals 24a and 24b of the outer-peripheral-side resistance heating element 24 are arranged inside the tubular shaft 40. In addition, an inner-peripheral-side thermocouple 48 for measuring a temperature near a center of the ceramic plate 20 and the outer-peripheral-side thermocouple 50 for measuring a temperature near an outer periphery of the ceramic plate 20 are also arranged inside the tubular shaft 40. The inner-peripheral-side thermocouple 48 is inserted into a recess 49 formed in the rear surface 20b of the ceramic plate 20, and a temperature measuring portion 48a at a tip end of the inner-peripheral-side thermocouple 48 is held in contact with the ceramic plate 20. The recess 49 is formed at a position not interfering with the terminals 22a, 22b, 24a and 24b and the elongate groove 26a. The outer-peripheral-side thermocouple 50 is a sheath thermocouple and is arranged such that, after passing through the guide hole 32a of the thermocouple guide 32 and the elongate hole 26, a temperature measuring portion 50a at a tip end reaches the end position 26e of the elongate hole 26. For example, a sheath thermocouple having a diameter of 0.5 mm or more and 1.5 mm or less and made of stainless (such as SUS) or a nickel alloy (such as Inconel (registered trademark)) may be used as the outer-peripheral-side thermocouple 50.

Figure 7:
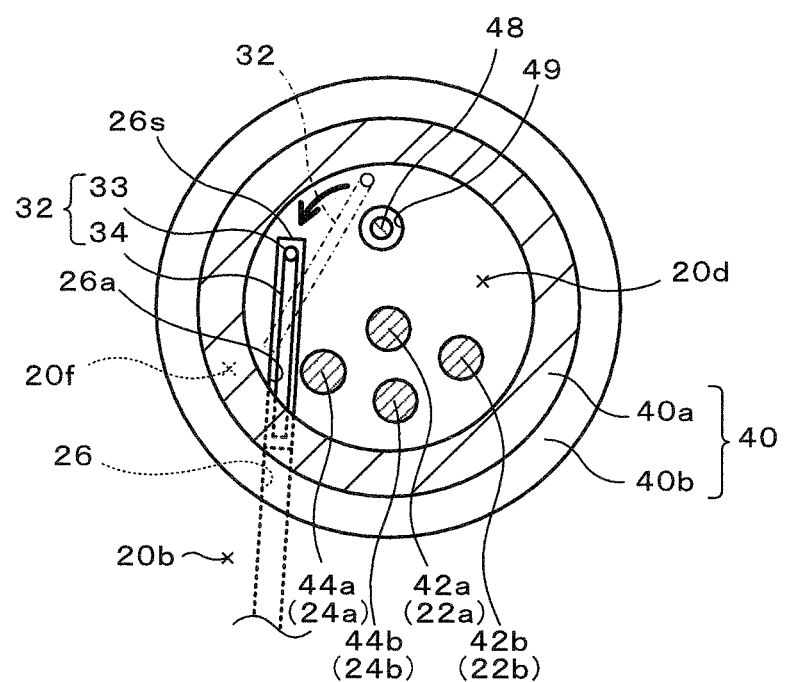
FIG. 7 is an explanatory view illustrating a method of attaching the thermocouple guide 32.
Figure 8:
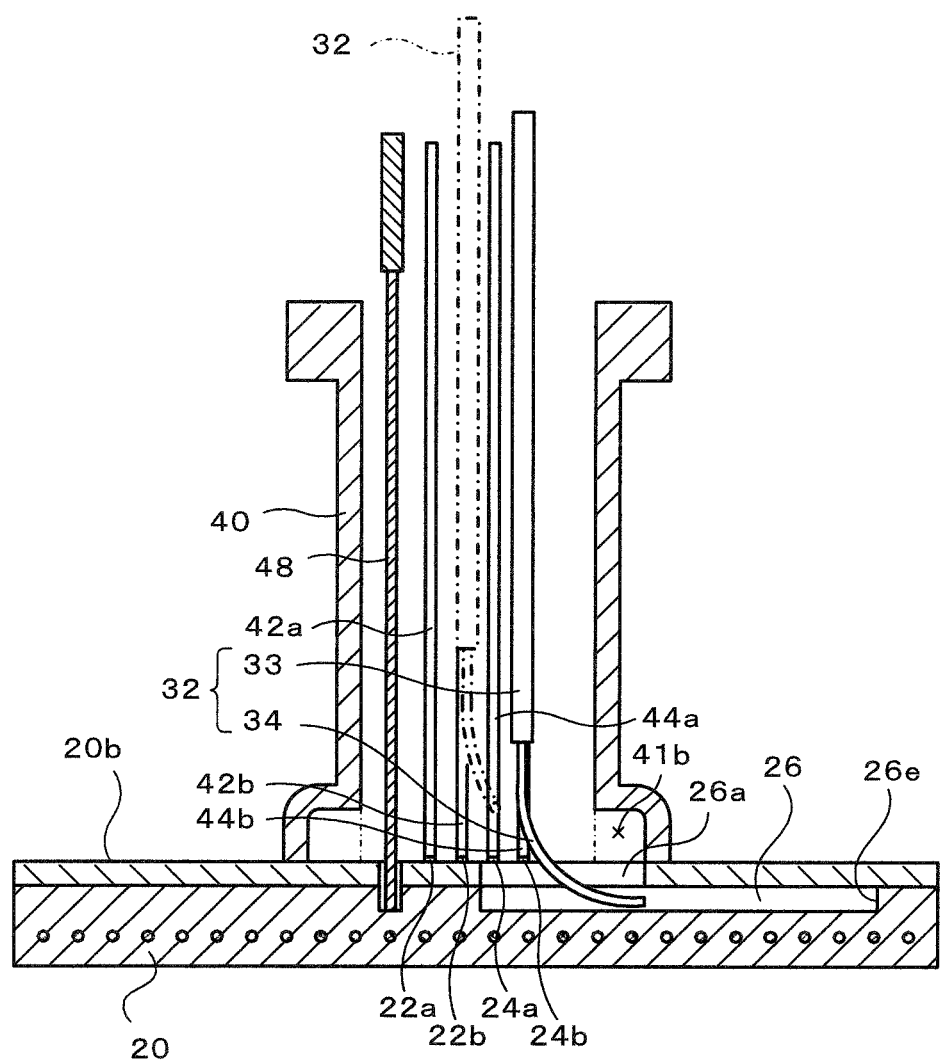
FIG. 8 is an explanatory view illustrating the method of attaching the thermocouple guide 32.
Figure 9:
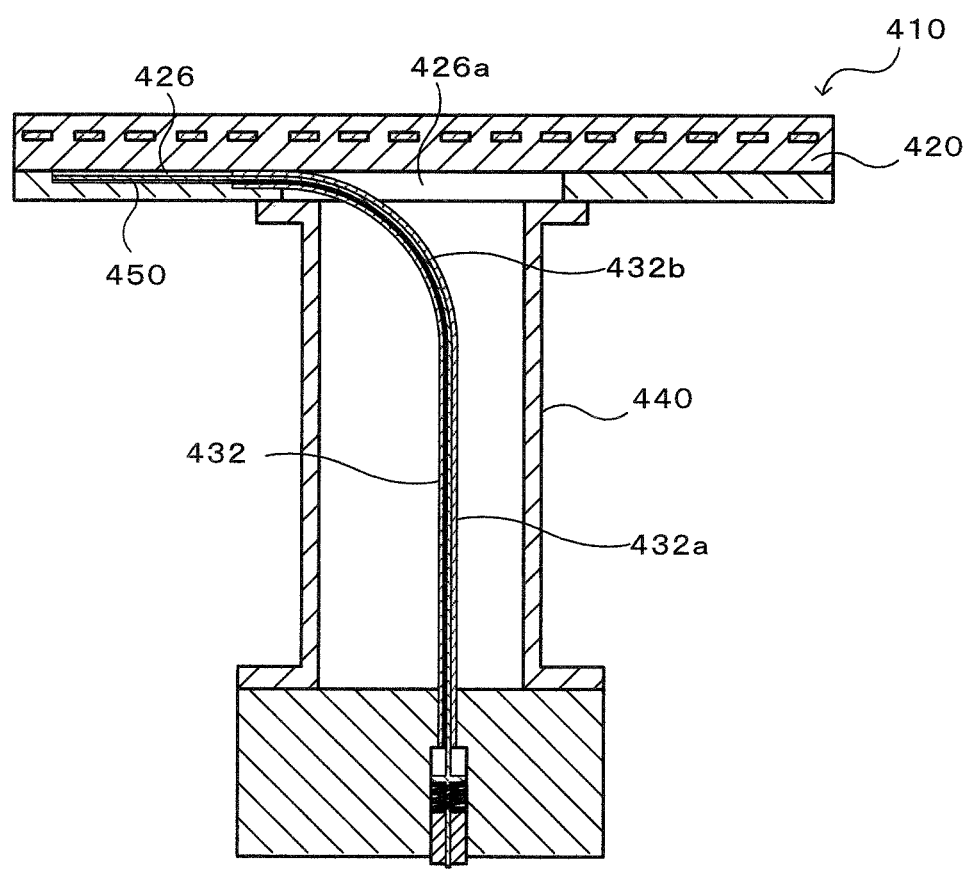
FIG. 9 is an explanatory view of a related-art ceramic heater.

The thermocouple guide 32 is attached in a last stage of a manufacturing process for the ceramic heater 10. FIGS. 7 and 8 illustrate situations in attaching the thermocouple guide 32. As illustrated in FIGS. 7 and 8, the tubular shaft 40 is bonded to the rear surface 20b of the ceramic plate 20, and the power feeder rods 42a, 42b, 44a and 44b are bonded respectively to the terminals 22a, 22b, 24a and 24b that are exposed at the rear surface 20b of the ceramic plate 20. Thereafter, the thermocouple guide 32 is attached. In this embodiment, when trying to insert the thermocouple guide 32 into the small-diameter portion 40a of the tubular shaft 40 after aligning an orientation of the second tube portion 34 of the thermocouple guide 32 with an orientation of the elongate groove 26a defining the inlet portion of the elongate hole 26, the thermocouple guide 32 cannot be inserted into the small-diameter portion 40a in the above-mentioned aligned state for the reason that a distance along which the elongate hole 26 and its extension appears in the within-shaft region 20d is shorter than the horizontal distance from the tip end of the second tube portion 34 to the center axis of the first tube portion 33 and hence the second tube portion 34 is caught on the small-diameter portion 40a. In consideration of the above point, the second tube portion 34 of the thermocouple guide 32 is first brought into a posture (see the thermocouple guide 32 denoted by one-dot-chain lines in FIGS. 7 and 8) not interfering with the small-diameter portion 40a and the power feeder rods 42a, 42b, 44a and 44b, and thereafter the second tube portion 34 is inserted to come closer to the rear surface 20b of the ceramic plate 20. After the tip end of the second tube portion 34 has reached the inner space of the large-diameter portion 40b, the tip end of the second tube portion 34 is fitted into the elongate groove 26a by turning the thermocouple guide 32 while causing the tip end of the second tube portion 34 to come into the expanded space 41b (see the thermocouple guide 32 denoted by solid lines in FIGS. 7 and 8). Thereafter, the outer-peripheral-side thermocouple 50 is inserted through the guide hole 32a of the thermocouple guide 32 until the temperature measuring portion 50a reaches the end position 26e of the elongate hole 26.

An example of use of the ceramic heater 10 will be described below. First, the ceramic heater 10 is installed inside the vacuum chamber (not illustrated), and the wafer W is placed on the wafer placement surface 20a of the ceramic heater 10. Then, electric power supplied to the inner-peripheral-side resistance heating element 22 is adjusted such that the temperature detected by the inner-peripheral-side thermocouple 48 becomes a predetermined inner-peripheral-side target temperature, and electric power supplied to the outer-peripheral-side resistance heating element 24 is adjusted such that the temperature detected by the outer-peripheral-side thermocouple 50 becomes a predetermined outer-peripheral-side target temperature. As a result, the temperature of the wafer W is controlled to be held at a desired temperature. Thereafter, the vacuum chamber is evacuated to be set to a vacuum atmosphere or a reduced pressure atmosphere, and plasma is generated in the vacuum chamber. By utilizing the generated plasma, CVD film formation or etching is performed on the wafer W.

In the above-described ceramic heater 10 and thermocouple guide 32 according to this embodiment, since the outer diameter $\phi o2$ of the second tube portion 34 is smaller than the outer diameter $\phi o1$ of the first tube portion 33, a width of an inlet portion of a thermocouple passage, namely a width of the elongate groove 26a, can be reduced. It is hence possible to secure a wider region where associated components, such as the terminals 22a, 22b, 24a and 24b and the recess 49, are to be arranged, and to increase a degree of freedom in layout of the associated components. Furthermore, since the outer diameter $\phi o1$ of the first tube portion 33 of the thermocouple guide 32 is greater than the outer diameter $\phi o2$ of the second tube portion 34, rigidity of the first tube portion 33 can be held relatively high. Moreover, suppression of thermal conduction (heat dissipation) from the ceramic plate 20 to the outside through the thermocouple guide 32 is also expected. Accordingly, improvement in thermal uniformity of the ceramic plate 20 and suppression of thermal influences upon members supporting the thermocouple guide 32 on an outer side of the tubular shaft 40 are further expected.

In the thermocouple guide 32, since the second tube portion 34 is welded to the first tube portion 33, the thermocouple guide 32 can be obtained by preparing the second tube portion 34 and the first tube portion 33 separately, and by welding both the tube portions to each other.

In the thermocouple guide 32, since the inner diameter $\phi i2$ of the second tube portion 34 is smaller than the inner diameter $\phi i1$ of the first tube portion 33, the outer diameter $\phi o2$ of the second tube portion 34 can be made even smaller than the outer diameter $\phi o1$ of the first tube portion 33 in comparison with the case in which the inner diameter $\phi i2$ of the second tube portion 34 is equal to the inner diameter $\phi i1$ of the first tube portion 33. In addition, when the outer diameter $\phi o2$ of the second tube portion 34 is set to a predetermined value, a wall thickness of the second tube portion 34 is increased corresponding to a decrease in the inner diameter $\phi i2$ of the second tube portion 34. Hence rigidity of the second tube portion 34 can be increased.

In the thermocouple guide 32, since the diameter of the second tube portion 34 is the same along the entire length, the second tube portion 34 in a stage before being welded can be easily prepared.

In the ceramic heater 10 according to this embodiment, since the elongate hole 26 is a thermocouple-insertion elongate hole into which the outer-peripheral-side thermocouple 50 is to be inserted, the outer-peripheral-side thermocouple 50 can be inserted by utilizing the elongate hole 26.

Since the length of the elongate groove 26a defining the inlet portion of the elongate hole 26 is set to be longer than or equal to that of the tip-side part 34b of the curved section 34c of the thermocouple guide 32, the tip-side part 34b being arranged in the elongate groove 26a, the thermocouple guide 32 can be more easily arranged in the elongate groove 26a.

It is needless to say that the present invention is not limited to the above-described embodiment, and that the present invention can be put into practice in various forms insofar as falling within the technical scope of the present invention.

For example, while, in the above-described embodiment, the second tube portion 34 of the thermocouple guide 32 includes the straight section 34s, the second tube portion 34 may not need to include the straight section 34s. Instead, the base end of the curved section 34c may be directly welded to the tip end of the first tube portion 33.

In the above-described embodiment, the thermocouple guide 32 may further include a tip-side straight section joined to an outlet of the second tube portion 34. The tip-side straight section is disposed to extend horizontally relative to the wafer placement surface 20a. With the presence of the tip-side straight section, the outer-peripheral-side thermocouple 50 can be more smoothly guided into the elongate hole 26. In the thermocouple guide 32 provided with the above-mentioned tip-side straight section, a length of a portion that is to be arranged in the elongate groove 26a increases. Hence the length of the elongate groove 26a is preferably set corresponding to an increase in the length of that portion.

While, in the above-described embodiment and FIGS. 4 and 5, the curved section 34c of the thermocouple guide 32 is formed to turn the extension direction from the first tube portion 33 through 90° (angle θ=90°), the angle θ may be smaller than 90°. Assuming that the curvature radius R is the same, as a value of the angle θ reduces, the stroke length S is shortened and hence the region where the associated components, such as the terminals 22a, 22b, 24a and 24b and the recess 49, are to be arranged is enlarged. The angle θ is preferably 50° or more and 90° or less and more preferably 75° or more and 90° or less. Under such a condition, after passing the thin and long outer-peripheral-side thermocouple 50 through the first tube portion 33 and the second tube portion 34 of the thermocouple guide 32, the outer-peripheral-side thermocouple 50 can be smoothly guided into the elongate hole 26, namely the thermocouple passage.

In the above-described embodiment, the curvature radius R of the curved section 34c is preferably 20 mm or more and 50 mm or less. When the curvature radius R is 20 mm or more, stress applied to the outer-peripheral-side thermocouple 50 in the first tube portion 33 and the second tube portion 34 of the thermocouple guide 32 upon insertion of the outer-peripheral-side thermocouple 50 is relatively small and hence the outer-peripheral-side thermocouple 50 can be smoothly guided into the elongate hole 26, namely the thermocouple passage. Furthermore, when the curvature radius R is 50 mm or less, the angle θ can be set to fall within the above-mentioned range even in the case in which the stroke length S cannot be set to be so long (for example, in the case in which the inner diameter of the small-diameter portion 40a of the tubular shaft 40 is relatively small, such as 35 mm or more and 45 mm or less) and hence the outer-peripheral-side thermocouple 50 can be smoothly guided into the elongate hole 26, namely the thermocouple passage. In particular, the curvature radius R in the range of 20 mm or more and 30 mm or less is preferable in that the outer-peripheral-side thermocouple 50 can be more smoothly guided into the elongate hole 26. On the other hand, the curvature radius R in the range of 30 mm or more and 50 mm or less is preferable in that the curvature (bend) of the thermocouple guide 32 is relatively small or the bent thermocouple guide is easier to return to its original state when the outer-peripheral-side thermocouple 50 is inserted. As a reference, Table 1 lists the results of conducting experiments of using the ceramic heaters 10 including the thermocouple guides 32 with the curvature radius R of the curved section 34c set to 20 mm, 30 mm, 40 mm, and 50 mm and inserting the outer-peripheral-side thermocouple 50 to be set in place. In the thermocouple guides 32, the inner diameters φi1 of the first tube portions 33 were unified to 2 mm, the outer diameters φo2 of the second tube portions 34 were unified to 2.2 mm, and the inner diameters φi2 of the second tube portions 34 were unified to 1.69 mm. In Table 1, the bend of the thermocouple guide was evaluated as "1" in the case in which the thermocouple guide was not bent when the thermocouple was inserted, "2" in the case in which the thermocouple guide was bent when the thermocouple was inserted, but returned to its original state at once, and "3" in the case in which the thermocouple guide was bent when the thermocouple was inserted, but returned to its original state after completion of the insertion. As seen from Table 1, when the curvature radius R was in the range of 20 mm or more and 50 mm or less, the evaluation of the bend of the thermocouple guide was any of "1", "2" and "3". Thus, the bend of the thermocouple guide was small, or the bent thermocouple guide was easy to return to its original state. When the curvature radius R was in the range of 30 mm or more and 50 mm or less, the evaluation of the bend of the thermocouple guide was "1" or "2". Thus, the bend of the thermocouple guide 32 was smaller, or the bent thermocouple guide was easier to return to its original state.

TABLE 1

| Second Tube Portion | | | First Tube Portion | Outer-peripheral-side Thermocouple | | Result of Experiment Evaluation of Bend of Thermocouple Guide* |
| --- | --- | --- | --- | --- | --- | --- |
| Curvature Radius R mm | Stroke Length S mm | Angle θ ° | Outer Diameter φ o1 mm | Sheath Material | Outer Diameter of Sheath mm | |
| 50 | 20 | 53.1 | 5 | SUS | 0.6 | 1 |
| 40 | 30 | 75.5 | 5 | SUS | 0.6 | 1 |
| 30 | 30 | 90 | 5 | SUS | 0.6 | 1 |

TABLE 1-continued

| Second Tube Portion | | | First Tube Portion | Outer-peripheral-side Thermocouple | | Result of Experiment Evaluation of Bend of Thermocouple Guide[X] |
|---|---|---|---|---|---|---|
| Curvature Radius R mm | Stroke Length S mm | Angle θ ° | Outer Diameter φo1 mm | Sheath Material | Outer Diameter of Sheath mm | |
| 20 | 20 | 90 | 5 | SUS | 0.6 | 3 |
| 50 | 20 | 53.1 | 5 | Inconel | 1 | 2 |
| 40 | 30 | 75.5 | 5 | Inconel | 1 | 2 |
| 30 | 30 | 90 | 5 | Inconel | 1 | 1 |
| 50 | 20 | 53.1 | 2.41 | SUS | 0.6 | 2 |
| 40 | 30 | 75.5 | 2.41 | SUS | 0.6 | 1 |
| 30 | 30 | 90 | 2.41 | SUS | 0.6 | 1 |

[X]"1" as the case in which the thermocouple guide was not bent when the thermocouple was inserted
"2" as the case in which the thermocouple guide was bent when the thermocouple was inserted, but returned to its original state at once
"3" as the case in which the thermocouple guide was bent when the thermocouple was inserted, but returned to its original state after coumpletion of the insertion In the above-described embodiment, the stroke length S of the curved section 34c is preferably 20 mm or more and 50 mm or less and more preferably 20 mm or more and 30 mm or less. Under such a condition, the angle θ and the curvature radius R can be each set to fall within the above-described range while the region where the associated components, such as the terminals 22a, 22b, 24a and 24b and the recess 49, are to be arranged is kept large. Hence the outer-peripheral-side thermocouple 50 can be smoothly guided into the elongate hole 26.

While, in the above-described embodiment, the second tube portion 34 is welded to the first tube portion 33, the second tube portion 34 may be bonded to the first tube portion 33 by a metallurgical bonding method (pressure bonding or diffusion bonding) other than the welding. Instead, the second tube portion 34 may be continuously joined with the first tube portion 33 by forming both the tube portions with one seamless tube.

While, in the above-described embodiment, the inner diameter φi2 of the second tube portion 34 is set to be smaller than the inner diameter φi1 of the first tube portion 33, the inner diameter φi2 of the second tube portion 34 may be set to be the same as the inner diameter φi1 of the first tube portion 33. In that case, since the guide hole 32a can be formed with no step attributable to a diameter difference at the seam between the second tube portion 34 and the first tube portion 33, the outer-peripheral-side thermocouple 50 can be smoothly passed through the guide hole 32a.

While, in the above-described embodiment, the outer diameter φo2 of the second tube portion 34 along the entire length is set to be smaller than the outer diameter φo1 of the first tube portion 33, it is just required that the outer diameter of at least the tip-side part 34b of the second tube portion 34 is smaller than the outer diameter φo1 of the first tube portion 33. For example, the outer diameter of a part of the second tube portion 34 other than the tip-side part 34b may be the same as the outer diameter φo1 of the first tube portion 33. When the outer diameter of the tip-side part 34b fitted into the elongate groove 26a is smaller than the outer diameter φo1 of the first tube portion 33, the width of the elongate groove 26a can be reduced.

While, in the above-described embodiment, the inner diameter φi2 of the second tube portion 34 along the entire length is set to be smaller than the inner diameter φi1 of the first tube portion 33, it is just required that the inner diameter of at least the tip-side part 34b of the second tube portion 34 is smaller than the inner diameter φi1 of the first tube portion 33. For example, the inner diameter of a part of the second tube portion 34 other than the tip-side part 34b may be the same as the inner diameter φi1 of the first tube portion 33. In such a case, the outer diameter of the tip-side part 34b can also be made even smaller than the outer diameter φo1 of the first tube portion 33 in comparison with the case in which the inner diameter of the tip-side part 34b is equal to the inner diameter φi1 of the first tube portion 33. In addition, when the outer diameter of the tip-side part 34b is set to a predetermined value, a wall thickness of the tip-side part 34b is increased corresponding to a decrease in the inner diameter of the tip-side part 34b. Hence rigidity of the tip-side part 34b can be increased.

In the above-described embodiment, the outer diameter φo1 of the first tube portion 33 is preferably 2.4 mm or more and 5 mm or less, and the outer diameter φo2 of the second tube portion 34 is preferably 1.9 mm or more and 2.3 mm or less. The inner diameter φi1 of the first tube portion 33 is preferably 1.8 mm or more and 2.2 mm or less, and the inner diameter φi1 of the second tube portion 34 is preferably 1.5 mm or more and 1.9 mm or less. The wall thickness of the first tube portion 33 is preferably 0.15 mm or more and 1.5 mm or less. Under such a condition, the rigidity of the first tube portion 33 can be made relatively high. The wall thickness of the second tube portion 34 is preferably 0.15 mm or more and 0.25 mm or less. Under such a condition, the rigidity of the second tube portion 34 can be made relatively high. Furthermore, since the outer diameter of the second tube portion 34 can be reduced and the inner diameter thereof can be increased, the groove size of the elongate groove 26a can be reduced while allowing the outer-peripheral-side thermocouple 50 to be smoothly inserted. As a result of comparing the thermocouple guides 32 in which the shape and the size of the second tube portion 34 and the length and the inner diameter of the first tube portion 33 were set to the predetermined shape and values and in which the outer diameter of the first tube portion 33 was changed, it was found that, when the outer-peripheral-side thermocouple 50 was inserted through the thermocouple guide 32, the curvature (bend) of the thermocouple guide 32 had a tendency to reduce or the bent thermocouple guide had a tendency to more easily return to its original state as the outer diameter φo1 of the first tube portion 33 increased. In addition, a ratio φo2/φo1 of the outer diameter φo2 of the second tube portion 34 to the outer diameter φo1 of the first tube portion 33 may be set to be, for example, 2/5 or more and 9/10 or less. A ratio $\phi i2/\phi i1$ of the inner diameter $\phi i1$ of the second tube portion 34 to the inner diameter $\phi i1$ of the first tube portion 33 may be set to be, for example, 3/4 or more and 19/20 or less.

In the above-described embodiment, the step caused in the guide hole 32a attributable to the diameter difference, namely a value of $(\phi i1-\phi i2)/2$, is preferably set to such a value as enabling the outer-peripheral-side thermocouple 50 to be smoothly guided into the elongate hole 26. The value of $(\phi i1-\phi i2)/2$ may be set to be 0.2 mm or less, for example, although depending on the shape and the type of the outer-peripheral-side thermocouple 50.

In the above-described embodiment, the curved section 34c is curved into the circular arc shape with the curvature radius R. In another example, however, the curved section 34c may have such a shape that the curve gradually becomes steeper (for example, the curvature radius gradually reduces) toward the tip end of the curved section 34c, or that the curve gradually becomes gentler (for example, the curvature radius gradually increases) toward the tip end of the curved section 34c. The curved section 34c may be curved in, for example, an elliptical arc shape or a parabolic shape.

In the above-described embodiment, the material of the thermocouple guide 32 is preferably stainless steel (such as SUS304). Using that material can increase heat resistance and corrosion resistance of the thermocouple guide 32. Furthermore, since that material has good workability, the thermocouple guide 32 can be easily formed.

While, in the above-described embodiment, the first tube portion 33 is arranged vertically to the wafer placement surface 20a, the first tube portion 33 may be arranged with a slight inclination (for example, within ±5°) relative to the vertical direction. From the viewpoint of avoiding the interference with the power feeder rods 42a, 42b, 44a and 44b and the inner-peripheral-side thermocouple 48, however, the inclination of the first tube portion 33 is preferably as small as possible.

While, in the above-described embodiment, the tubular shaft 40 includes the small-diameter portion 40a with the inner diameter d1 and the large-diameter portion 40b with the inner diameter d2 (>d1), the tubular shaft 40 may have a straight shape, or the inner diameter d1 and the inner diameter d2 may be the same. When the inner diameter d1 and the inner diameter d2 are the same, there is no distinction between the circular cylindrical space 41a and the expanded space 41b in the inner space 41 and between the within-shaft region 20d and the expanded region 20f in the rear surface 20b.

While, in the above-described embodiment, each of the resistance heating elements 22 and 24 has the shape of a coil, the shape of the resistance heating element is not limited to a coil for any special reason. The resistance heating element may be, for example, a printed pattern, or may have a ribbon-like or mesh-like shape.

In the above-described embodiment, an electrostatic electrode or an RF electrode may be incorporated in the ceramic plate 20 in addition to the resistance heating elements 22 and 24. When the electrostatic electrode is incorporated, a terminal (one of the associated components) of the electrostatic electrode is disposed in the within-shaft region 20d of the ceramic plate 20. The terminal of the electrostatic electrode is disposed at a position in the within-shaft region 20d other than the elongate groove 26a. When the RF electrode is incorporated, a terminal (one of the associated components) of the RF electrode is disposed in the within-shaft region 20d of the ceramic plate 20. The terminal of the RF electrode is disposed at a position in the within-shaft region 20d other than the elongate groove 26a.

While, in the above-described embodiment, the length of the thermocouple guide 32 in an up-down direction is set to be longer than the height of the tubular shaft 40, the length of the thermocouple guide 32 may be the same as or shorter than the height of the tubular shaft 40.

In the above-described embodiment, the inner peripheral zone Z1 may be divided into a plurality of inner peripheral small zones, and the resistance heating element may be wired in a one-stroke pattern for each of the inner peripheral small zones. Furthermore, the outer peripheral zone Z2 may be divided into a plurality of outer peripheral small zones, and the resistance heating element may be wired in a one-stroke pattern for each of the outer peripheral small zones. In such a case, the number of the terminals increases corresponding to the number of the divided small zones. In the above-described embodiment, however, since the elongate groove 26a is formed to come into the expanded region 20f, it is possible to secure a wide region where the terminals and so on are to be arranged. Accordingly, the ceramic heater according to this embodiment is adaptable for an increase in the number of the terminals.

In the above-described embodiment, the position of the recess 49 may be determined after determining the position of the elongate groove 26a or may be determined before determining the position of the elongate groove 26a. In the latter case, the recess 49 is regarded as one of the associated components, and the position of the elongate groove 26a is determined not to interfere with the recess 49.

In the above-described embodiment, the thermocouple guide 32 is attached after bonding the tubular shaft 40 to the rear surface 20b of the ceramic plate 20 and further bonding the power feeder rods 42a, 42b, 44a and 44b respectively to the terminals 22a, 22b, 24a and 24b in the ceramic plate 20. However, the procedures for attaching the thermocouple guide 32 are not limited to that case. In another example, after bonding the tubular shaft 40 to the rear surface 20b of the ceramic plate 20 and attaching the thermocouple guide 32, the power feeder rods 42a, 42b, 44a and 44b may be bonded respectively to the terminals 22a, 22b, 24a and 24b.

The present application claims priority from Japanese Patent Application No. 2020-102174, filed on Jun. 12, 2020, the entire contents of which are incorporated herein by reference.

What is claimed is:

1. A ceramic heater comprising:
    a ceramic plate formed in a disk-like shape and having a wafer placement surface;
    a tubular shaft bonded to a rear surface of the ceramic plate on an opposite side to the wafer placement surface;
    an inner-peripheral-side resistance heating element embedded in an inner peripheral zone of the ceramic plate;
    an outer-peripheral-side resistance heating element embedded in an outer peripheral zone of the ceramic plate;
    associated components including a pair of terminals of the inner-peripheral-side resistance heating element and a pair of terminals of the outer-peripheral-side resistance heating element;
    an elongate hole extending from a start point in a region of the rear surface of the ceramic plate, the region being positioned within the tubular shaft when viewed from below, to an end position in an outer peripheral portion of the ceramic plate;

an elongate groove defining an inlet portion of the elongate hole; and a thermocouple guide comprising:

a first tube portion of a straight shape; and a second tube portion connected to the first tube portion and formed of a curved section that is formed to turn an extension direction from the first tube portion, wherein an outer diameter of at least a tip-side part of the curved section, the tip-side part extending from a tip end of the curved section through a predetermined length, is smaller than an outer diameter of the first tube portion, and wherein-the tip-side part of the curved section is arranged in the elongate groove; and wherein (i) the curved section has a shape such that the curvature radius gradually reduces toward the tip end of the curved section, (ii) the curved section has a shape such that the curvature radius gradually increases toward the tip end of the curved section, (iii) the curved section has an elliptical arc shape, or (iv) the curved section has a parabolic shape.

2. The ceramic heater according to claim 1, wherein an inner diameter of at least the tip-side part of the curved section is smaller than an inner diameter of the first tube portion.

3. The ceramic heater according to claim 1, wherein an outer diameter of the second tube portion along an entire length of the thermocouple guide is smaller than the outer diameter of the first tube portion.

4. The ceramic heater according to claim 3, wherein an inner diameter of the second tube portion along the entire length of the thermocouple guide is smaller than an inner diameter of the first tube portion.

5. The ceramic heater according to claim 1, wherein the thermocouple guide includes a curvature radius of the curved section is 20 mm or more and 50 mm or less, a stroke length of the curved section is 20 mm or more and 50 mm or less, and the curved section is formed to turn the extension direction from the first tube portion through an angle of 50° or more and 90° or less.

6. The ceramic heater according to claim 1, wherein the elongate hole is a thermocouple-insertion elongate hole into which a thermocouple is to be inserted.

7. The ceramic heater according to claim 1, wherein a length of the elongate groove is set to be longer than or equal to a length of the tip-side part of the curved section of the thermocouple guide, the tip-side part being arranged in the elongate groove.

8. The ceramic heater according to claim 1, further comprising a thermocouple inserted through both the thermocouple guide and the elongate hole.

9. The ceramic heater according to claim 1, wherein the thermocouple guide is made of metal.

10. The ceramic heater according to claim 1, wherein the tubular shaft includes a small-diameter portion and a large-diameter portion, and an inner space of the tubular shaft includes a circular cylindrical space with the same diameter as an inner diameter of the small-diameter portion, and an annular expanded space positioned on an outer side of the circular cylindrical space and surrounded by the large-diameter portion.

11. The ceramic heater according to claim 1, wherein the second tube portion of the thermocouple guide is welded to the first tube portion.

* * * * *